United States Patent
Stirton et al.

(10) Patent No.: US 6,746,882 B1
(45) Date of Patent: Jun. 8, 2004

(54) METHOD OF CORRECTING NON-LINEARITY OF METROLOGY TOOLS, AND SYSTEM FOR PERFORMING SAME

(75) Inventors: James Broc Stirton, Austin, TX (US); Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/301,194

(22) Filed: Nov. 21, 2002

(51) Int. Cl.$^7$ ............................................. H01L 21/66
(52) U.S. Cl. ............................................. 438/14; 438/15
(58) Field of Search ........................... 438/14, 15, 16; 356/601, 351, 445

(56) References Cited

U.S. PATENT DOCUMENTS

| | | | | |
|---|---|---|---|---|
| 3,829,220 A | * | 8/1974 | Parkinson | .................... 356/640 |
| 6,051,348 A | * | 4/2000 | Marinaro et al. | ............... 430/30 |
| 6,245,584 B1 | * | 6/2001 | Marinaro et al. | ............... 438/14 |
| 6,433,871 B1 | * | 8/2002 | Lensing et al. | ............... 356/450 |
| 6,433,878 B1 | * | 8/2002 | Niu et al. | .................... 356/603 |
| 6,464,563 B1 | * | 10/2002 | Lensing | ......................... 451/6 |
| 6,486,036 B1 | * | 11/2002 | Miethke et al. | ............. 438/401 |
| 6,489,005 B1 | * | 12/2002 | Armacost et al. | ........... 428/119 |
| 6,537,833 B1 | * | 3/2003 | Lensing | ......................... 438/14 |
| 6,614,540 B1 | * | 9/2003 | Stirton | ......................... 356/630 |
| 6,650,423 B1 | * | 11/2003 | Markle et al. | ............... 356/601 |
| 6,673,638 B1 | * | 1/2004 | Bendik et al. | ................. 438/14 |
| 2002/0135781 A1 | * | 9/2002 | Singh et al. | ................. 356/601 |

\* cited by examiner

*Primary Examiner*—John F. Niebling
*Assistant Examiner*—Olivia T. Luk
(74) *Attorney, Agent, or Firm*—Williams, Morgan & Amerson, P.C.

(57) ABSTRACT

The present invention is generally directed to various methods of correcting non-linearity in metrology tools, and a system for performing same. In one illustrative embodiment, the method comprises creating a non-linear model of measurement data produced by a metrology tool when measuring a plurality of features, each of which has a different, known feature size, measuring a production feature using the metrology tool to produce metrology data for the production feature, determining a correction factor to be applied to the metrology data for the production feature by comparing the non-linear model to a linear model, and applying the determined correction factor to the metrology data for the production feature.

41 Claims, 2 Drawing Sheets

METHOD OF CORRECTING NON-LINEARITY OF METROLOGY TOOLS, AND SYSTEM FOR PERFORMING SAME

BACKGROUND OF THE INVENTION

1. Field of the Invention

This invention relates generally to semiconductor fabrication technology, and, more particularly, to various methods of correcting non-linearity of metrology tools, and a system for performing same.

2. Description of the Related Art

There is a constant drive within the semiconductor industry to increase the operating performance of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors. Moreover, the density of such transistors on a wafer per unit area has dramatically increased as a result of, among other things, the reduction in feature sizes, and an overall desire to minimize the size of various integrated circuit products.

By way of background, modern integrated circuit devices, e.g., microprocessors, ASICs, memory devices, etc., are comprised of millions of field effect transistors formed on a semiconducting substrate, such as silicon. The substrate may be doped with either N-type or P-type dopant materials. An illustrative field effect transistor 10, as shown in FIG. 1, may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit product is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

The gate electrode 14 has a critical dimension 12, i.e., the width of the gate electrode 14, that approximately corresponds to the channel length 13 of the device when the transistor 10 is operational. Thus, it is very important that the critical dimension 12 of the gate electrode 14 be formed very accurately. Even small errors in the critical dimension 12 of the gate electrode 14 can result in the failure of the finished product to meet certain target electrical performance characteristics, e.g., switching speed, leakage current, etc. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

As device dimensions have continued to shrink, the packing density of the semiconductor devices, e.g., transistors, has increased. That is, ever increasing numbers of transistors or memory cells are located on the same plot space of a semiconducting substrate. As a result of this increased device density, the conductive metal lines and contacts or vias that connect these various devices have also been reduced in physical size, and they are also packed more closely together. In general, the resistance of a metal line is inversely proportional to the cross-sectional area of the metal line. Thus, all other things being equal, it is important that the cross-sectional area of the metal line be maintained above certain minimum levels such that the resistance of the metal line does not exceed allowable limits. Unanticipated increases in the resistance of a metal line may adversely impact device performance, e.g., a reduction in operating frequency, increased heat build-up, increased power consumption, etc.

In recent years, improvement in manufacturing techniques have enabled integrated circuit manufacturers to produce features, e.g., gate electrodes, metal lines, etc., with very small physical dimensions. For example, using current technology, the critical dimension 12 of a gate electrode 14 for a transistor 10 in a high performance microprocessor may be approximately 120–180 nm, and further reduction in the size or scale of such features is anticipated in the future. Unfortunately, as feature sizes continue to decrease, it becomes very difficult to accurately measure such features with the requisite degree of precision. This can be very problematic in that even very small variations in the size of the features may have an adverse impact on device performance and profitability.

For example, after a group of integrated circuit devices are manufactured, they may be subjected to one or more electrical performance tests to determine an electrical characteristic, e.g., switching speed, of the device. Based upon these tests, it may be determined the devices are not operating fast enough. As a result, it may be decided that the critical dimension 12 of the gate electrode 14 structures for the next group of devices to be manufactured needs to be reduced from 100 nm (the critical dimension for the original group of devices) to 98 nm. However, if, due to errors in obtaining metrology data, the features are manufactured with a critical dimension 12 of 98.5 nm, then the finished devices will not exhibit the desired electrical performance characteristic, i.e., increased operating speed. As a result, a number of wafers may be processed wherein the resulting devices do not meeting the targeted electrical performance characteristics.

A variety of metrology tools, e.g., CD scanning electron microscopes (SEM), tunneling electron microscopes (TEM), an optical overlay tool, and a film thickness measurement tool such as an optical-based tool or a profilometer, tend to provide very accurate data over a limited range of measurements. The more the metrology tools are used outside of this range, the greater the error in the measurement data. Stated another way, the metrology tools exhibit non-linear characteristics. Typically, in an effort to overcome or compensate for such non-linearity, metrology tools are finely tuned to measure features having a very small range of sizes. For example, a particular CD-SEM may be tuned to measure gate electrode features having a critical dimension range of 100–120 nm. If the metrology tool is employed to measure feature sizes outside of this range, the metrology tool may need to be re-tuned for the new range of feature sizes. Alternatively, separate metrology tools may be provided wherein the separate tools are each tuned to measure features having different size ranges. Such tuning and the use of multiple metrology tools can be time-consuming and wasteful of manufacturing resources.

The present invention is directed to various methods and systems that may solve, or at least reduce, some or all of the aforementioned problems.

SUMMARY OF THE INVENTION

The present invention is generally directed to various methods of correcting non-linearity in metrology tools, and a system for performing same. In one illustrative embodiment, the method comprises creating a non-linear model of measurement data produced by a metrology tool when measuring a plurality of features, each of which have a different, known feature size, measuring a production feature using the metrology tool to produce metrology data for the production feature, determining a correction factor to be applied to the metrology data for the production feature by comparing the non-linear model to a linear model, and applying the determined correction factor to the metrology data for the production feature.

In another illustrative embodiment, the method comprises creating a non-linear model of measurement data produced by a metrology tool when measuring a plurality of features, each of which have a different, known feature size, measuring a production feature formed above a semiconducting substrate using the metrology tool to produce metrology data for the production feature, providing the metrology data for the production feature to a controller that determines a correction factor to be applied to the metrology data for the production feature by comparing the non-linear model to a linear model, and applying the determined correction factor to the metrology data for the production feature.

In yet another illustrative embodiment, the method comprises creating a non-linear model of measurement data produced by a scanning electron microscope when measuring a plurality of features, each of which have a different, known feature size, measuring a production feature using the scanning electron microscope to produce metrology data for the production feature, providing the metrology data for the production feature to a controller that determines a correction factor to be applied to the metrology data for the production feature by comparing the non-linear model to a linear model, and applying the determined correction factor to the metrology data for the production feature.

BRIEF DESCRIPTION OF THE DRAWINGS

The invention may be understood by reference to the following description taken in conjunction with the accompanying drawings, in which like reference numerals identify like elements, and in which.

Figure 1:
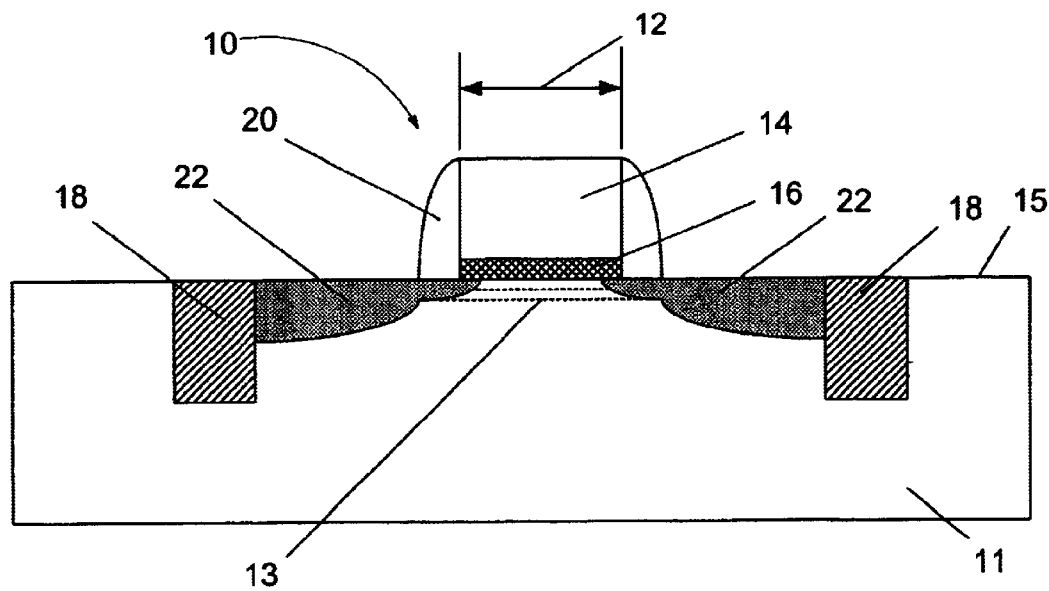
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of correcting non-linearity of metrology tools, and a system for performing same. As will be readily apparent to those skilled in the art upon a complete reading of the present application, the present method is applicable to the measurement of any of a variety of different type of features, e.g., gate electrodes, conductive lines, etc. Moreover, the present invention is applicable to a variety of technologies, e.g., NMOS, PMOS, CMOS, etc., and it is readily applicable to a variety of devices, including, but not limited to, logic devices, memory devices, etc.

As will be understood by those skilled in the art after a complete reading of the present application, the present invention may be employed with a variety of different types of metrology tools that may exhibit non-linear characteristics over a given operating range. For example, the present invention may be used with metrology tools such as a scanning electron microscope (SEM), a tunneling electron microscope (TEM), an optical overlay tool, and a film thickness measurement tool such as an optical-based tool or a profilometer. For ease of reference, the present invention will be disclosed in the context where the metrology tool is a CD-SEM that is used to measure various features found on an integrated circuit product. However, the present invention should not be considered as limited to any particular type of metrology tool unless such limitations are clearly set forth in the appended claims.

In a very broad sense, the present invention is directed to various inventive methods that enable more accurate measurement of physical dimensions of very small features using a metrology tool, such as a scanning electron microscope (SEM). For example, in the case of manufacturing integrated circuit products, e.g., microprocessors, such metrology tools may be used to measure the critical dimension 12 of gate electrode 14 structures, the size of conductive metal lines, patterned photoresist features, the size of openings in a process layer, etc. The physical structure and use of a CD-SEM are well known to those skilled in the art and thus will not be described herein so as not to obscure the present invention.

In general, such SEMs are tuned or adjusted such that they exhibit a very high degree of accuracy within a typically very small range. However, for measurements that are beyond this range, the SEMs may introduce an unacceptable level of errors in the measurement process. By way of example only, a SEM may be tuned such that measuring a known feature size of 100 nm, it accurately measures this feature as 100 nm. However, if the same SEM is used to measure features having known dimensions of 120 nm and 140 nm, the SEM may indicate that such features have measurements of 121 nm (+1 nm) and 143 nm (+3 nm), respectively. Thus, in general, as the SEM is used to measure dimensions beyond its specifically tuned range, errors may result. Moreover, in some cases, the magnitude of the errors may increase as measurements vary from this finely tuned range.

Figure 2:
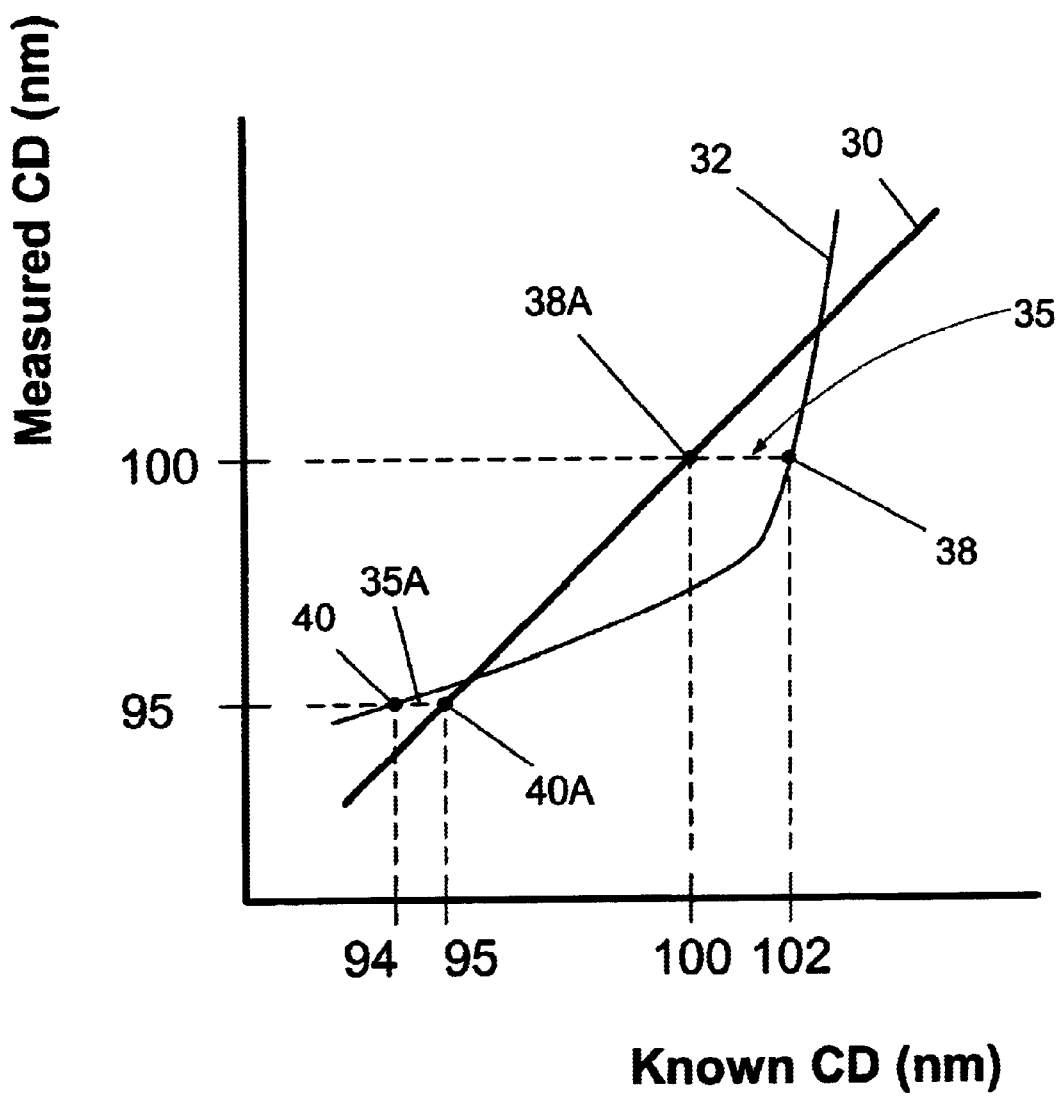
FIG. 2 is a graphical depiction of various measurements taken with a CD-SEM.

FIG. 2 is a graphical depiction indicating the non-linearity of measurements made using an illustrative SEM. Measured critical dimensions using the SEM are plotted on the vertical axis, while known critical dimensions are plotted on the horizontal axis. Ideally, the measured critical dimension will always equal the known critical dimension of the feature. Such an ideal situation is depicted by the line 30. However, in practice, the measurements obtained using a SEM does not fit this ideal, linear model over a very large range of desired sizes. Rather, as indicated by line 32, actual measurement data exhibits a non-linear pattern. The line 32 has been exaggerated for purposes of explanation and clarity. The degree or amount of non-linearity, i.e., the divergence from a linear model, may vary depending upon a variety of features, such as type of metrology tool employed, the type of features measured and/or the range of feature sizes, etc. For example, using a SEM, a feature having a known critical dimension of 100 nm may actually be indicated as having a measured critical dimension of 102 nm when measured using a microscope. Thus, an error of +2 nm is introduced into the process. As stated previously, the magnitude of the error may vary depending upon factors such as how large are the features being measured. Thus, to arrive at the true value for the measured feature, the data obtained from the SEM needs to be reduced by 2 nm to arrive at the true size of the feature.

By sampling enough data points, a higher order model, as indicated by the line 32, may be established for metrology data obtained by a particular metrology tool. This higher order model may be a second or third order equation depending upon a variety of factors, such as the type of tool used and the type of features measured, etc. The higher order model may be developed by measuring a plurality of features, each of which has a known, different feature size. The known feature size may be determined by use of additional metrology techniques, e.g., the size of the features in a reticle, electrical testing, an atomic force microscope (AFM), etc. Alternatively, known feature sizes may be determined by measuring a particular feature with a variety of metrology tools and declaring the known size to be that which is indicated by the vast majority of data points using known statistical analysis techniques.

Once the non-linear model is established, the correction factor at any point may be readily determined. For example, with reference to FIG. 2, at point 38, a correction factor 35 of −2 nm may be made to the metrology data obtained using the SEM. That is, while the metrology data from the SEM indicates the size of the feature is 102 nm (point 38), the true size of the feature is 100 nm (as indicated at point 38A). Thus, when the metrology tool, e.g., the SEM, indicates a feature measurement of 102 nm, the correction factor of −2 nm needs to be applied to that measured value to arrive at the true size of the measured feature. At point 40, the metrology data produced by the SEM indicates a feature size of 94 nm for a feature having a known feature size of 95 nm, as indicated at point 40A. Thus, the correction factor 35A in this case is +1 nm. That is, when the SEM reports a measured value of 94 nm, 1 nm must be added to the value reported by the SEM to arrive at the true feature size. By establishing this higher order, non-linear model, a metrology tool may be used to measure feature sizes over a wide range of values, and costly and time-consuming fine-tuning of such metrology tools for use over relatively narrow ranges of feature sizes may be avoided.

Figure 3:
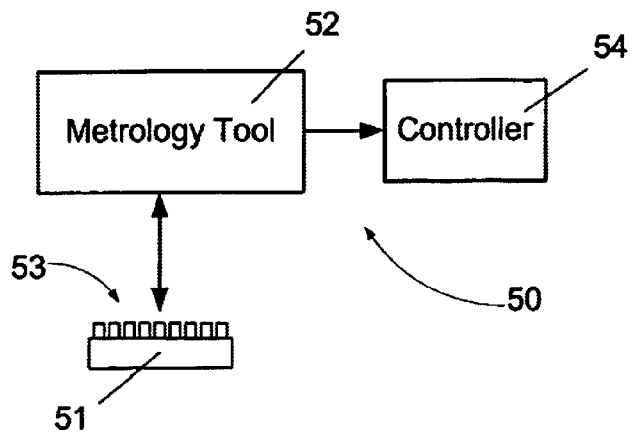
FIG. 3 is a schematic depiction of an illustrative system that may be employed with the present invention.

An illustrative system 50 that may be used in one embodiment of the present invention is shown in FIG. 3. The system 50 is comprised of a metrology tool 52 and a controller 54. As indicated in FIG. 3, the wafer 51 is representative of one or more wafers having a plurality of features 53, formed thereabove. As stated previously, a variety of metrology tools 52 may be used with the present invention, e.g., a SEM, a TEM and a profilometer.

The controller 54, e.g., a computer, may be used to make the corrections to the data produced by the metrology tool 52 as described herein. More specifically, the controller 52 may be used to create and update the non-linear model 32 periodically or at desired intervals. The non-linear model 32 may be established by a variety of known modeling techniques, such as regressive least squares (RLS) techniques. When the metrology tool 52 is used to make a measurement, the data from the metrology tool 52 is provided to the controller 54. In turn, the controller 54 then determines a correction factor for the particular measurement by comparing the non-linear model 32 to the linear model 30 at the appropriate location. Thereafter, the controller 54 then applies this determined correction factor to the data obtained from the metrology tool 52 to arrive at the true size of the measured feature.

In the illustrated embodiments, the controller 54 is a computer programmed with software to implement the functions described herein. Moreover, the functions described for the controller 54 may be performed by one or more controllers spread through the system. For example, the controller 54 may be a fab level controller that is used to control processing operations throughout all or a portion of a semiconductor manufacturing facility. Alternatively, the controller 54 may be a lower level computer that controls only portions or cells of the manufacturing facility. Moreover, the controller 54 may be a stand-alone device, or it may reside on the metrology tool 52. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 54, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Through use of the present invention, a non-linear model may be established for a particular metrology tool 52. Thereafter, a correction factor may be obtained for metrology data obtained using the metrology tool 52. The correction factor may be determined based upon a comparison of the non-linear model to the idealized linear model at the particular size of interest. Thereafter, this correction factor may be applied to the metrology data obtained by the metrology tool 52 to arrive at a true value for the measured feature size. As a result of this methodology, errors may be reduced in determining critical dimensions of features on integrated circuit devices and device performance and yields may improve.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of using a metrology tool, comprising:
   creating a non-linear model of measurement data produced by said metrology tool when measuring a plurality of features, each of which has a different, known feature size;
   measuring a production feature using said metrology tool to produce metrology data for said production feature;
   determining a correction factor to be applied to said metrology data for said production feature by comparing said non-linear model to a linear model; and
   applying said determined correction factor to said metrology data for said production feature.

2. The method of claim 1, wherein said metrology tool is comprised of at least one of a scanning electron microscope, a tunneling electron microscope and a profilometer.

3. The method of claim 1, wherein said production feature is comprised of at least one of a gate electrode, a conductive metal line, an opening in a process layer, and a patterned photoresist feature.

4. The method of claim 1, wherein a controller is used to determine said correction factor.

5. The method of claim 1, wherein said correction factor is positive.

6. The method of claim 1, wherein said correction factor is negative.

7. The method of claim 1, wherein said non-linear model is created using a controller.

8. The method of claim 1, wherein said non-linear model is created using a regressive least squares (RLS) technique.

9. The method of claim 1, wherein said linear model reflects measured values of said plurality of said features that correspond with said known feature sizes of said features.

10. The method of claim 1, wherein applying said determined correction factor to said metrology data for said production feature comprises subtracting said correction factor from said metrology data for said production feature.

11. The method of claim 1, wherein applying said determined correction factor to said metrology data for said production feature comprises adding said correction factor to said metrology data for said production feature.

12. A method of using a metrology tool, comprising:
   creating a non-linear model of measurement data produced by said metrology tool when measuring a plurality of features, each of which has a different, known feature size;
   measuring a production feature formed above a semiconducting substrate using said metrology tool to produce metrology data for said production feature;
   providing said metrology data for said production feature to a controller that determines a correction factor to be applied to said metrology data for said production feature by comparing said non-linear model to a linear model; and
   applying said determined correction factor to said metrology data for said production feature.

13. The method of claim 12, wherein said metrology tool is comprised of at least one of a scanning electron microscope, a tunneling electron microscope and a profilometer.

14. The method of claim 12, wherein said production feature is comprised of at least one of a gate electrode, a conductive metal line, an opening in a process layer, and a patterned photoresist feature.

15. The method of claim 12, wherein said correction factor is positive.

16. The method of claim 12, wherein said correction factor is negative.

17. The method of claim 12, wherein said non-linear model is created using a controller.

18. The method of claim 12, wherein said non-linear model is created using a regressive least squares (RLS) technique.

19. The method of claim 12, wherein said linear model reflects measured values of said plurality of said features that correspond with said known feature sizes of said features.

20. The method of claim 12, wherein applying said determined correction factor to said metrology data for said production feature comprises subtracting said correction factor from said metrology data for said production feature.

21. The method of claim 12, wherein applying said determined correction factor to said metrology data for said production feature comprises adding said correction factor to said metrology data for said production feature.

22. A method of using a scanning electron microscope, comprising:

creating a non-linear model of measurement data produced by said scanning electron microscope when measuring a plurality of features, each of which has a different, known feature size;

measuring a production feature using said scanning electron microscope to produce metrology data for said production feature;

providing said metrology data for said production feature to a controller that determines a correction factor to be applied to said metrology data for said production feature by comparing said non-linear model to a linear model; and applying said determined correction factor to said metrology data for said production feature.

23. The method of claim 22, wherein said production feature is comprised of at least one of a gate electrode, a conductive metal line, an opening in a process layer, and a patterned photoresist feature.

24. The method of claim 22, wherein said correction factor is positive.

25. The method of claim 22, wherein said correction factor is negative.

26. The method of claim 22, wherein said non-linear model is created using a controller.

27. The method of claim 22, wherein said non-linear model is created using a regressive least squares (RLS) technique.

28. The method of claim 22, wherein said linear model reflects measured values of said plurality of said features that correspond with said known feature sizes of said features.

29. The method of claim 22, wherein applying said determined correction factor to said metrology data for said production feature comprises subtracting said correction factor from said metrology data for said production feature.

30. The method of claim 22, wherein applying said determined correction factor to said metrology data for said production feature comprises adding said correction factor to said metrology data for said production feature.

31. A method of using a metrology tool, comprising:

creating a non-linear model of measurement data produced by said metrology tool when measuring a plurality of gate electrode features, each of which has a different, known feature size;

measuring a production gate electrode feature formed above a semiconducting substrate using said metrology tool to produce metrology data for said production gate electrode feature;

determining a correction factor to be applied to said metrology data for said production gate electrode feature by comparing said non-linear model to a linear model; and applying said determined correction factor to said metrology data for said production gate electrode feature.

32. The method of claim 31, wherein said metrology tool is comprised of at least one of a scanning electron microscope, a tunneling electron microscope and a profilometer.

33. The method of claim 31, wherein said metrology data for said production gate electrode feature is provided to a controller that determines said correction factor.

34. The method of claim 31, wherein a controller is used to determine said correction factor.

35. The method of claim 31, wherein said correction factor is positive.

36. The method of claim 31, wherein said correction factor is negative.

37. The method of claim 31, wherein said non-linear model is created using a controller.

38. The method of claim 31, wherein said non-linear model is created using a regressive least squares (RLS) technique.

39. The method of claim 31, wherein said linear model reflects measured values of said plurality of said gate electrode features that correspond with said known feature sizes of said gate electrode features.

40. The method of claim 31, wherein applying said determined correction factor to said metrology data for said gate electrode production feature comprises subtracting said correction factor from said metrology data for said gate electrode production feature.

41. The method of claim 31, wherein applying said determined correction factor to said metrology data for said production gate electrode feature comprises adding said correction factor to said metrology data for said production gate electrode feature.

* * * * *